US011765981B1

(12) United States Patent
Miura et al.

(10) Patent No.: US 11,765,981 B1
(45) Date of Patent: Sep. 19, 2023

(54) MAGNETORESISTANCE EFFECT ELEMENT AND MAGNETIC MEMORY

(71) Applicant: TOHOKU UNIVERSITY, Miyagi (JP)

(72) Inventors: Sadahiko Miura, Miyagi (JP); Hiroaki Honjo, Miyagi (JP); Hideo Sato, Miyagi (JP); Shoji Ikeda, Miyagi (JP); Tetsuo Endoh, Miyagi (JP)

(73) Assignee: TOHOKU UNIVERSITY, Miyagi (JP)

( * ) Notice: Subject to any disclaimer, the term of this patent is extended or adjusted under 35 U.S.C. 154(b) by 480 days.

(21) Appl. No.: 17/264,655

(22) PCT Filed: Jun. 21, 2019

(86) PCT No.: PCT/JP2019/024673
§ 371 (c)(1),
(2) Date: Aug. 6, 2021

(87) PCT Pub. No.: WO2020/026637
PCT Pub. Date: Feb. 6, 2020

(30) Foreign Application Priority Data

Aug. 2, 2018 (JP) .................................. 2018-145615

(51) Int. Cl.
*G11C 11/00* (2006.01)
*H10N 50/10* (2023.01)
*G11C 11/16* (2006.01)

(52) U.S. Cl.
CPC ........... *H10N 50/10* (2023.02); *G11C 11/161* (2013.01)

(58) Field of Classification Search
CPC ...................................................... H01N 50/10
See application file for complete search history.

(56) References Cited

U.S. PATENT DOCUMENTS 9,166,143 B1 10/2015 Gan et al.
2008/0062581 A1* 3/2008 Parkin .................... B82Y 10/00
427/127

(Continued)

FOREIGN PATENT DOCUMENTS

JP 2012-64625 A 3/2012
JP 2016-178301 A 10/2016
(Continued)

OTHER PUBLICATIONS

International Preliminary Report on Patentability for related PCT App No. PCT/JP2019/024673 dated Aug. 18, 2020, 10 pages.

(Continued)

*Primary Examiner* — Pho M Luu
(74) *Attorney, Agent, or Firm* — Procopio, Cory, Hargreaves & Savitch LLP

(57) ABSTRACT

A magnetoresistance effect element with a small element size can be provided which achieves both an increase in a thermal stability factor $\Delta$ and a reduction in a writing current $I_{C0}$ and which improves a performance index $\Delta/I_{C0}(\mu A^{-1})$ obtained by dividing the thermal stability factor $\Delta$ by the writing current $I_{C0}$. The magnetoresistance effect element includes a first reference layer (B1), a first junction layer (11), a first magnetic layer (21), a first non-magnetic coupling layer (31), a second magnetic layer (22), and a second junction layer (12), and a film thickness of the first non-magnetic coupling layer (31) is 0.1 nm or more and 0.3 nm or less.

6 Claims, 10 Drawing Sheets

(56) References Cited

U.S. PATENT DOCUMENTS

2012/0211811 A1* 8/2012 Nagahara ............... H10N 50/01
257/295
2019/0198755 A1* 6/2019 Ito ......................... H10B 61/22

FOREIGN PATENT DOCUMENTS

| WO | 2013/153942 A1 | 10/2013 |
| WO | 2017/086481 A1 | 5/2017 |
| WO | 2018/020730 A1 | 2/2018 |

OTHER PUBLICATIONS

International Search Report for related PCT Application No. PCT/JP2019/024673 dated Aug. 27, 2019, 5 pages.

Written Opinion of the International Searching Authority for related PCT Application No. PCT/JP2019/024673 dated Aug. 27, 2019, 10 pages, dated Sep. 24, 2013.

Thomas L. et al., Perpendicular spin transfer torque magnetic random access memories with high spin torque efficiency and thermal stability for embedded applications (invited), Journal of Applied Physics, https://doi.org/10.1063/1.4870917, 7 pages.

Hu G. et al., Key Parameters Affecting STT-MRAM Switching Efficiency and Improved Device Performance of 400° C.-Compatible p-MTJs, IBM-Samsung MRAM Alliance, 38.3.1-38.3.4, IEDM17-847, New York, USA, 4 pages.

* cited by examiner

MAGNETORESISTANCE EFFECT ELEMENT AND MAGNETIC MEMORY

This application is a U.S. National Stage Application of PCT Application No. PCT/JP2019/024673, filed Jun. 21, 2019, which claims priority to Application No. 2018-145615, filed Aug. 2, 2018, the contents of which are incorporated by reference.

TECHNICAL FIELD

The present invention relates to a magnetoresistance effect element and to a magnetic memory including the magnetoresistance effect element.

BACKGROUND ART

An MRAM (Magnetic Random Access Memory; magnetic memory) is a nonvolatile memory utilizing an MTJ (Magnetic Tunnel Junction).

MRAMs which do not consume power during standby, which have high-speed operability and high write durability, and which enable miniaturization of memory sizes are attracting attention as a next-generation working memory.

A magnetoresistance effect element used in an MRAM is based on a structure in which a non-magnetic layer to act as a tunnel barrier layer is sandwiched between a recording layer and a reference layer that are ferromagnetic layers. A resistance value of the magnetoresistance effect element is small when magnetization of the recording layer and the reference layer is in a parallel arrangement and large when magnetization is in an antiparallel arrangement, and the two resistive states are assigned to pieces of bit information "0" and "1". Writing bit information is performed by spin-transfer torque (STT) which uses a transfer of angular momentum intrinsic to electrons by directly passing a current through the magnetoresistance effect element. On the other hand, TMR (Tunnel Magnetoresistance) through the tunnel barrier layer is used to read information.

In this case, with the magnetoresistance effect element used in an MRAM, the magnetoresistance effect element must be first integrated in plurality and information must be read and written with respect to a specific element. For this reason, generally, a memory cell made up of a magnetoresistance effect element, a select transistor, a word line, and a bit line are arranged in an array to construct a memory array, in which case voltage is applied to the word line and the bit line of each memory array.

Characteristics that are important in terms of application of a magnetoresistance effect element used in an MRAM are: (i) a large thermal stability factor $\Delta$; (ii) a small writing current $I_{C0}$; (iii) a large magnetoresistance (MR) ratio of the magnetoresistance effect element; and (iv) a small element size. (i) is a characteristic required for nonvolatility of a magnetic memory, (ii) is a characteristic required to reduce a size of a cell transistor and reduce a cell size and to lower power consumption, (iii) is a characteristic required to accommodate high-speed reading, and (iv) is a characteristic required to reduce cell area and increase capacity.

The writing current $I_{C0}$ represented by (ii) is proportional to an element area when writing voltage is constant. Therefore, since element dimensions must be taken into consideration when comparing elements or when matching with literature values, the writing current $I_{C0}$ may prove to be difficult to handle as an index. On the other hand, a performance index $\Delta/I_{C0}(\mu A^{-1})$ which implies both (i) a large thermal stability factor $\Delta$ and (ii) a small writing current $I_{C0}$ is widely used in the industry as a performance index of an element given that the performance index $\Delta/I_{C0}(\mu A^{-1})$ may be associated with a physical property value called a damping factor $\alpha$ using Math. 2 to be described later (refer to NPL 1 and NPL 2). It should be noted that the performance index $\Delta/I_{C0}$ is a value obtained by dividing the stability factor $\Delta$ by the writing current $I_{C0}$. In addition, with the recent realization of higher integration of elements, there is a strong demand for increasing the (v) performance index $\Delta/I_{C0}$.

In order to increase (i) the thermal stability factor $\Delta$ among the characteristics described above, a magnetoresistance effect element has been developed that includes a so-called double interface in which an interface that comes into contact with a recording layer has been increased (refer to FIG. 11). As shown in FIG. 11, a recording layer (A1) of a magnetoresistance effect element including a double interface is configured so as to be sandwiched between a first junction layer (11) that acts as a tunnel barrier layer and a second junction layer (12). The present structure is based on a technical idea which, given that the thermal stability factor $\Delta$ is expressed by an equation given in Math. 1 below, aims to increase interface magnetic anisotropy energy density $K_i$ by increasing the interface that comes into contact with the recording layer.

$$\Delta = \frac{E}{k_B T} = \frac{K_{eff} t S}{k_B T} = \left( K_i + K_b t - \frac{M_s^2}{2\mu_0} t \right) \frac{S}{k_B T} \quad \text{[Math. 1]}$$

In the equation given in Math. 1, E denotes an energy barrier, kB denotes Boltzmann's coefficient, T denotes an absolute temperature, $K_{eff}$ denotes an effective magnetic anisotropy energy density per unit volume, t denotes a film thickness, Kent denotes an effective magnetic anisotropy energy density per unit area, S denotes an area of a recording layer, $K_i$ denotes an interface magnetic anisotropy energy density, Kb denotes bulk (crystal) magnetic anisotropy energy density, $M_s$ denotes saturation magnetization, and $\mu_0$ denotes vacuum magnetic permeability. In addition, an effective magnetic anisotropy energy density of an entire element is denoted by $K_{eff}t^*$.

In addition to the above, a further improvement of the thermal stability factor $\Delta$ by inserting a non-magnetic coupling layer in a recording layer sandwiched by a so-called double interface has been disclosed (refer to PTL 1 and PTL 2).

CITATION LIST

Patent Literature

[PTL 1] WO 2013/153942
[PTL 2] Japanese Patent Application Laid-open No. 2012-64625

Non Patent Literature

[NPL 1] L. Tomas, G. Jan, J. Zhu, H. Liu, Y-J. Lee, R-Y Tong, K. Pi, Y-J. Wang, D. Shen, R. He, J. Haq, J. Teng, V. Lam, K. Huang, T. Zhong, T. Torng P-K. Wang, Journal of Applied Physics 115, 172615 (2014)
[NPL 2] G. Hu, M. G. Gotwald, Q. He, J. H. Park, G. Lauer, J. J. Nowak, S. L. Brown, B. Doris, D. Edelstein, E. R. Evarts, P. Hashemi, B. Khan, Y H. Kim, C. Kothandaraman, N. Marchack, E. J. O'Suillivian, M. Reuter, R. P. Roertazzi, J. Z. Sun, T. Suwannasiri, P. L. Trouilloud, Y.

Zhu and D. C. Worledge, International Electron Device Meeting (IEDM) 2017, p. 844

SUMMARY OF INVENTION

Technical Problem

An element size that is premised in the prior art documents described above is larger than the (iv) miniaturized element size that is being called for. On the other hand, miniaturizing an element reduces an area S of the element and causes the thermal stability factor Δ to decrease from the equation expressed by Math. 1. Therefore, when increasing capacity through miniaturization, a further increase in the thermal stability factor Δ is required.

However, when considering an element having characteristics such as those described above, since an element whose element size is roughly equal to or smaller than a range of 40 nm to 60 nm differs from conventional elements whose element size exceeds this range in terms of a type of dominant magnetic coupling and a mechanism of magnetization reversal, there is a problem in that findings in prior art alone are not sufficient to further increase the thermal stability factor Δ.

In addition, the junction layer of the so-called double interface and the non-magnetic coupling layer in the recording layer are provided in order to improve the thermal stability factor Δ and the like. On the other hand, the writing current $I_{C0}$ is also an important index as described above. In other words, increasing both the thermal stability factor Δ and the performance index $Δ/I_{C0}$ is important from the perspective of characteristics of a magnetic tunnel junction.

However, with prior art, it is difficult to achieve both a high thermal stability factor Δ and a high performance index $Δ/I_{C0}$ particularly in a fine region.

The present invention has been made in consideration of the circumstances described above towards next-generation magnetoresistance effect elements which are required to be finer and represents a discovery and completion of a structure of a magnetoresistance effect element in which (v) performance index $Δ/I_{C0}(\mu A^{-1})$ has been improved in a region with a small element size.

Solution to Problem

In order to solve the problem described above, a magnetoresistance effect element according to the present invention includes: a first reference layer (B1); a first junction layer (11) which is provided adjacent to the first reference layer (B1); a first magnetic layer (21) which is provided adjacent to the first junction layer (11) on an opposite side to the first reference layer (B1) and whose magnetization direction is a direction perpendicular to a film surface; a first non-magnetic coupling layer (31) which is provided adjacent to the first magnetic layer (21) on an opposite side to the first junction layer (11); a second magnetic layer (22) which is provided adjacent to the first non-magnetic coupling layer (31) on an opposite side to the first magnetic layer (21) and whose magnetization direction is a direction perpendicular to a film surface; and a second junction layer (12) which is provided adjacent to the second magnetic layer (22) on an opposite side to the first non-magnetic coupling layer (31), wherein the first magnetic layer (21), the first non-magnetic coupling layer (31), and the second magnetic layer (22) constitute a first recording layer (A1), the first junction layer (11) and the second junction layer (12) include O (oxygen) and the first junction layer (11) is a tunnel barrier layer, the first non-magnetic coupling layer (31) includes W or Mo and a film thickness of the first non-magnetic coupling layer (31) is 0.1 nm or more and 0.3 nm or less, and an element size is 60 nm or smaller.

In addition, a magnetoresistance effect element according to the present invention includes: a first reference layer (B1); a first junction layer (11) which is provided adjacent to the first reference layer (B1); a first magnetic layer (21) which is provided adjacent to the first junction layer (11) on an opposite side to the first reference layer (B1) and whose magnetization direction is a direction perpendicular to a film surface; a first non-magnetic coupling layer (31) which is provided adjacent to the first magnetic layer (21) on an opposite side to the first junction layer (11); a second magnetic layer (22) which is provided adjacent to the first non-magnetic coupling layer (31) on an opposite side to the first magnetic layer (21) and whose magnetization direction is a direction perpendicular to a film surface; and a second junction layer (12) which is provided adjacent to the second magnetic layer (22) on an opposite side to the first non-magnetic coupling layer (31), wherein the first magnetic layer (21), the first non-magnetic coupling layer (31), and the second magnetic layer (22) constitute a first recording layer (A1), the first junction layer (11) and the second junction layer (12) include O (oxygen) and the first junction layer (11) is a tunnel barrier layer, a film thickness of the first non-magnetic coupling layer (31) is 0.1 nm or more and 0.3 nm or less, and an element size is 40 nm or smaller.

The magnetoresistance effect element may further include, between the second magnetic layer (22) and the second junction layer (12): a second non-magnetic coupling layer (32) which is provided adjacent to the second magnetic layer (22); and a third magnetic layer (23) which is provided adjacent to the second non-magnetic coupling layer (32) on an opposite side to the second magnetic layer (22) and adjacent to the second junction layer (12) and whose magnetization direction is a direction perpendicular to a film surface.

The magnetoresistance effect element may further include, between the second magnetic layer (22) and the second junction layer (12): a non-magnetic insertion layer (41) which is provided adjacent to the second magnetic layer (22); a fourth magnetic layer (24) which is provided adjacent to the non-magnetic insertion layer (41) on an opposite side to the second magnetic layer (22) and whose magnetization direction is a direction perpendicular to a film surface; a third non-magnetic coupling layer (33) which is provided adjacent to the fourth magnetic layer (24) on an opposite side to the non-magnetic insertion layer (41); and a fifth magnetic layer (25) which is provided adjacent to the third non-magnetic coupling layer (33) on an opposite side to the fourth magnetic layer (24) and adjacent to the second junction layer (12) and whose magnetization direction is a direction perpendicular to a film surface.

In addition, a magnetic memory according to the present invention includes the magnetoresistance effect element described above.

Advantageous Effects of Invention

According to the present invention, a magnetoresistance effect element with an element size of 60 nm or smaller can be provided which achieves both an increase in a thermal stability factor Δ and a reduction in a writing current $I_{C0}$ and which improves a performance index $Δ/I_{C0}(\mu A^{-1})$.

An "element size" of a magnetoresistance effect element in the present specification is a value of a diameter of a perfect circle when it is assumed that an area obtained from a short side and a long side of a shape of a junction surface of a reference layer/a tunnel barrier layer/a recording layer is a perfect circle. When an element shape is an ellipse, an element size is obtained from a major axis and a minor axis. When an element shape is a circle, an element size is a diameter thereof.

DESCRIPTION OF EMBODIMENTS

Figure 1:
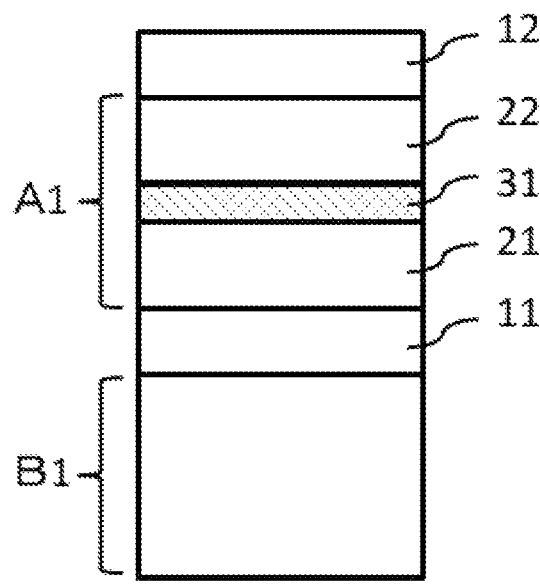
FIG. 1 is a longitudinal section view showing an example of a structure of a magnetoresistance effect element according to the present invention.

Hereinafter, a magnetoresistance effect element and a magnetic memory according to the present invention will be described in detail with reference to the drawings.

It should be noted that the drawings merely represent examples and, while descriptions will be given using reference characters, the reference characters are not intended to limit the present invention in any way whatsoever.

First Embodiment

Element Structure

FIG. 1 shows a basic structure of a first embodiment of the present invention. In a basic structure of the magnetoresistance effect element, a first reference layer (B1)/a first junction layer (11)/a first magnetic layer (21)/a first non-magnetic coupling layer (31)/a second magnetic layer (22)/a second junction layer (12) are sequentially and adjacently arranged. The first magnetic layer (21)/the first non-magnetic coupling layer (31)/the second magnetic layer (22) constitute a first recording layer (A1), and the first reference layer (B1) and the first magnetic layer (21) are coupled by a magnetic tunnel junction by the first junction layer (11).

When the magnetoresistance effect element is connected to a magnetic memory cell, the magnetoresistance effect element has a lower electrode which is provided on the first reference layer (B1) on an opposite side to the first junction layer (11) and an upper electrode which is provided on the second junction layer (12) on an opposite side to the second magnetic layer (22).

The first reference layer (B1) is a ferromagnetic layer and whose magnetization direction is fixed to a direction perpendicular to a film surface.

The first reference layer (B1) is a ferromagnetic body which at least contains any of 3d ferromagnetic transition metal elements and more preferably contains at least one of Co, Fe, and Ni. Specific examples of the first reference layer (B1) are combinations of elements such as Co, Fe, Ni, CoFe, FeNi, CoNi, CoB, FeB, NiB, CoFeB, FePt, TbTeCo, MnAl, and MnGa. The first reference layer (B1) may be an alloy that further contains a non-magnetic element such as W, Ta, Hf, Zr, Nb, Mo, Ti, V, Cr, Si, Al, B, Pd, and Pt. Among the elements combined as described above, a content of some elements may be a minute amount or other magnetic materials or non-magnetic materials used to improve material characteristics may be further contained.

In addition, a thin non-magnetic coupling layer may be inserted between ferromagnetic bodies of the first reference layer (B1). Examples of a material of the non-magnetic coupling layer include Ta, W, Hf, Zr, Nb, Mo, Ti, Mg, MgO, Cr, and V.

The first reference layer (B1) may have a monolayer structure, a lamination layer structure, a multilayer structure, a lamination layer structure with, Co/Pt or the like, Pt, Ru, Ir, Rh, W, Ni, and Pd, a thin-layer ferri structure, and the like. When a ferromagnetic layer in the reference layer has a multilayer structure, an orientation of magnetization may be fixed to parallel or antiparallel depending on a material and/or a film thickness of the layers.

Furthermore, a fixed layer or the like may be provided adjacent to the first reference layer (B1) on an opposite side to the first junction layer (11).

The first junction layer (11) is a tunnel barrier layer for which a material containing O (oxygen) is used and which is dominant in magnetoresistance of the present magnetoresistance effect element. The first junction layer (11) preferably contains at least O and Mg so that a combination of materials of the first junction layer (11) being sandwiched between the first reference layer (B1) and the first magnetic layer (21) produces a large rate of change of magnetoresistance. In addition, a conductive oxide containing Mn, Fe, Co, Ni, V, Ti, Ga, Nb, Mo, Ru, Ir, Ce, Pb, Zn, In or the like or a weakly-oxidized conductive oxide of which oxidization is not complete such as Mg—O, Al—O, Mg—Al—O, Si—O, Ti—O, Hf—O, Ta—O, or W—O may be used, and the conductive oxide may contain a minute amount of other elements. Among the elements combined as described above, a content of some elements may be a minute amount or other magnetic materials or non-magnetic materials used to improve material characteristics may be further contained.

In addition, a material containing oxygen is more desirably selected for the first junction layer (11) so as to create interface magnetic anisotropy at an interface with the first magnetic layer (21) and, even in this aspect, MgO is even more desirable.

In order to increase a magnetoresistance MR ratio, the film thickness of the first junction layer (11) is preferably 0.5 nm or more and more preferably 0.8 nm or more. Furthermore, in order to produce a small resistance area product RA, the film thickness of the first junction layer (11) is preferably 1.2 nm or less, more preferably 1.1 nm or less, and even more preferably 1.0 nm or less. Therefore, the film thickness of the first junction layer (11) is preferably adjusted to a range of 0.5 nm to 1.2 nm and more preferably adjusted to a range of 0.8 nm to 1.1 nm.

The first magnetic layer (21) and the second magnetic layer (22) are ferromagnetic layers and whose magnetization direction can be reversed in a direction perpendicular to a film surface.

The first magnetic layer (21) and the second magnetic layer (22) are ferromagnetic bodies which at least contain any of 3d ferromagnetic transition metal elements and more preferably contains at least one of Co, Fe, and Ni. Specific examples of the first magnetic layer (21) and the second magnetic layer (22) are Co, Fe, Ni, CoFe, FeNi, CoNi, CoB, FeB, NiB, CoFeB, FePt, TbTeCo, MnAl, and MnGa and, among these examples, Fe, Co, FeB, CoB, and CoFeB are more desirable.

In addition, the first magnetic layer (21) is desirably a material having interface magnetic anisotropy in a direction perpendicular to a film surface at an interface with the first junction layer (11), the second magnetic layer (22) is desirably a material having interface magnetic anisotropy in a direction perpendicular to a film surface at an interface with the second junction layer (12), and Fe, Co, FeB, CoB, and CoFeB are more desirable. In other words, interface perpendicular magnetic anisotropy at the interface between the first magnetic layer (21) and the first junction layer (11) and the interface between the second magnetic layer (22) and the second junction layer (12) desirably makes magnetization of the first magnetic layer (21) and the second magnetic layer (22) perpendicular to a film surface.

Furthermore, the first magnetic layer (21) and the second magnetic layer (22) may contain a non-magnetic element such as W, Ta, Hf, Zr, Nb, Mo, Ti, V, Cr, Si, Al, B, Pd, and Pt. Among these non-magnetic elements, B and V are preferable also from the perspective of handleability.

A sum of film thicknesses of the first magnetic layer (21) and the second magnetic layer (22) is preferably within a range of 1.6 nm to 3.2 nm and more preferably within a range of 2.0 nm to 2.6 nm. This is because, in both cases where the film thicknesses are thinner and the film thicknesses are thicker, perpendicular magnetic anisotropy weakens when MgO or the like is used in the first junction layer (11) and the second junction layer (12).

The first non-magnetic coupling layer (31) contains a non-magnetic element such as W, Ta, Hf, Zr, Nb, Mo, Ti, V, Cr, Si, Al, B, Pd, and Pt. Since a non-magnetic coupling layer can also have perpendicular magnetic anisotropy in a direction of a film surface by absorbing B or the like in an adjacent magnetic layer or the like, an element with a large atomic radius and a relatively large lattice spacing in a bcc (body-centered cubic lattice) is preferable. W, Ta, Hf, Zr, Nb, Mo, Ti, V, and the like are more preferable, and W and Mo are even more preferable.

For the purpose of increasing the performance index $\Delta/I_{C0}$, a film thickness of the first non-magnetic coupling layer (31) is preferably 0.3 nm or less. Details will be provided later with reference to FIGS. 12 to 15.

A material containing O (oxygen) is used as the second junction layer (12), and the second junction layer (12) preferably contains at least Mg and O. In addition, a conductive oxide containing Mn, Fe, Co, Ni, V, Ti, Ga, Nb, Mo, Ru, Ir, Ce, Pb, Zn, In or the like or a weakly-oxidized conductive oxide of which oxidization is not complete such as Mg—O, Al—O, Mg—Al—O, Si—O, Ti—O, Hf—O, Ta—O, or W—O may be used, and the conductive oxide may contain a minute amount of other elements. Among the elements combined as described above, a content of some elements may be a minute amount or other magnetic materials or non-magnetic materials used to improve material characteristics may be further contained.

A film thickness of the second junction layer (12) is preferably adjusted to a range of 0.2 nm to 2.0 nm, more preferably adjusted to a range of 0.5 nm to 1.2 nm, and even more preferably adjusted to a range of 0.8 nm to 1.1 nm.

From the perspective of increasing the performance index $\Delta/I_{C0}$, an element size of the magnetoresistance effect element according to the first embodiment is preferably 60 nm or smaller and more preferably 40 nm or smaller or smaller than 40 nm. Details will be provided later with reference to FIGS. 12 to 15.

As described above, an "element size" of a magnetoresistance effect element in the present specification is a value of a diameter of a perfect circle when it is assumed that an area obtained from a short side and a long side of a shape of a junction surface of a reference layer/a tunnel barrier layer/a recording layer is a perfect circle. When an element shape is an ellipse, an element size is obtained from a major axis and a minor axis. When an element shape is a circle, an element size is a diameter thereof.

Hereinafter, contents of an evaluation regarding the structure of the first embodiment will be explained.

Evaluation of Performance Index $\Delta/I_{C0}$

As described earlier, the performance index $\Delta/I_{C0}$ is a value obtained by dividing the thermal stability factor $\Delta$ by the writing current $I_{C0}$.

Figure 12:
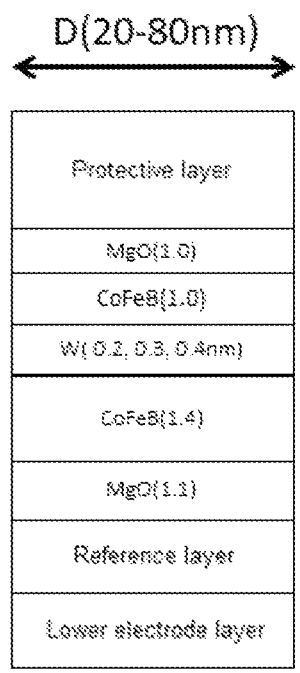
FIG. 12 is a longitudinal section view showing a structure of an element for evaluating a performance index $\Delta/I_{C0}$.

FIG. 12 shows an outline of a structure of an element for evaluating the performance index $\Delta/I_{C0}$. The element size was set to a range of 20 nm to 80 nm and a film thickness of a non-magnetic coupling layer made of W was set to 0.2, 0.3, and 0.4 nm.

A current with a pulse width of 1 μs to 5 ms was passed through samples of the element for evaluation, and a resistance value of each sample was measured to obtain switching probability due to a writing current. Next, based on a relationship among the measured switching probability, a current value, and a pulse width, the thermal stability factor $\Delta$ of each sample and $I_{C0}$ corresponding to a writing current at 1 ns were obtained.

In addition, in order to take variations in each of the samples into consideration, around 10 samples of a same structure and a same element size were evaluated and median values of the thermal stability factor $\Delta$ and the writing current $I_{C0}$ were used for analysis.

Figure 13:
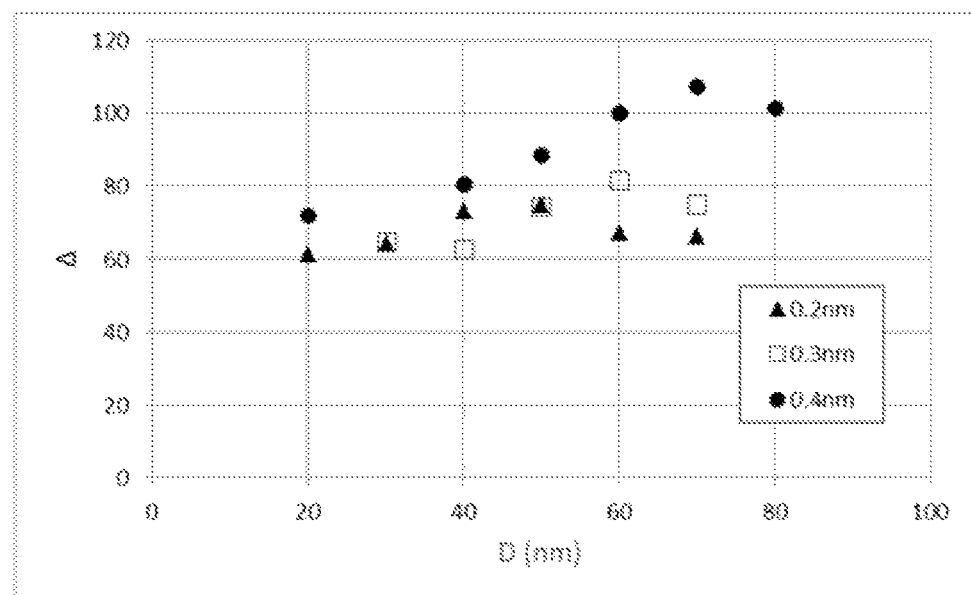
FIG. 13 is a graph showing a relationship among an element size, a film thickness of a non-magnetic coupling layer, and a thermal stability factor $\Delta$.

FIG. 13 and Table 1 show the thermal stability factor $\Delta$ for each element size D (nm). FIG. 13 shows an abscissa representing the element size D (nm) and an ordinate representing the thermal stability factor $\Delta$ and plots respective values of the thermal stability factor Δ while varying the film thickness of the non-magnetic coupling layer, and Table 1 organizes specific numerical values thereof.

TABLE 1

Thermal stability factor Δ (median value)

| | | Film thickness of non-magnetic coupling layer | | |
|---|---|---|---|---|
| | | 0.2 nm | 0.3 nm | 0.4 nm |
| Element size | 20 nm | 61.5 | | 72.0 |
| | 30 nm | 64.5 | 64.8 | |
| | 40 nm | 73.5 | 62.7 | 80.6 |
| | 50 nm | 75.0 | 74.3 | 88.4 |
| | 60 nm | 67.5 | 81.8 | 100.1 |
| | 70 nm | 66.3 | 74.9 | 107.4 |
| | 80 nm | | | 101.3 |

FIG. 13 and Table 1 reveal that the thermal stability factor Δ is 60 or higher in all evaluated elements having element sizes of 20 nm to 80 nm.

Figure 14:
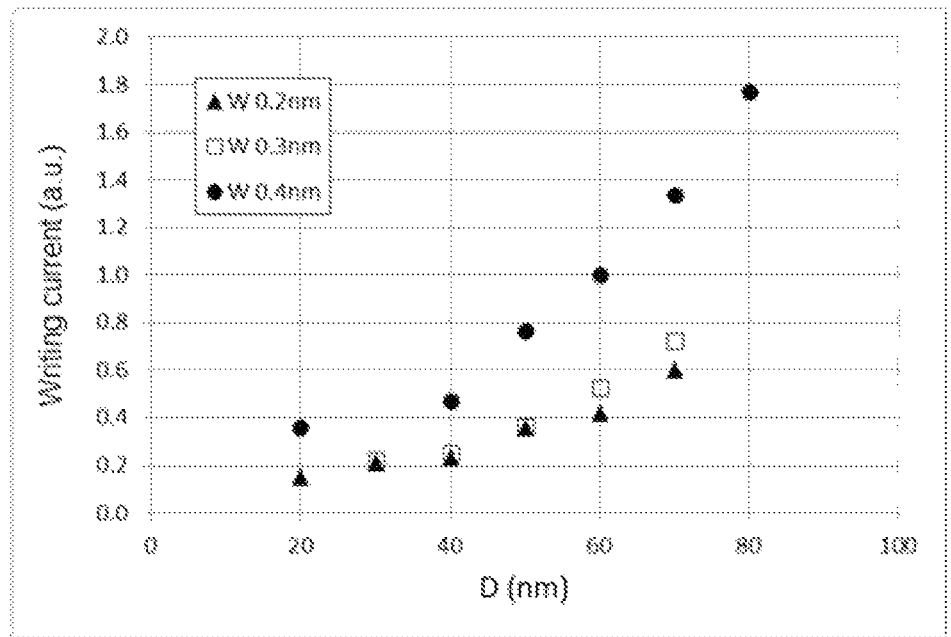
FIG. 14 is a graph showing a relationship among an element size, a film thickness of a non-magnetic coupling layer, and a writing current $I_{C0}$.

Next, FIG. 14 and Table 2 show a relationship of the writing current $I_{C0}$ for each element size. FIG. 14 shows an abscissa representing the element size D (nm) and an ordinate representing a relative value of the writing current $I_{C0}$ when the writing current $I_{C0}$ of a sample having an element size of 60 nm and a film thickness of a non-magnetic coupling layer of 0.4 nm is assumed to be 1, and plots respective relative values of the writing current $I_{C0}$ while varying the film thickness of the non-magnetic coupling layer, and Table 2 organizes specific numerical values thereof.

TABLE 2

Writing current (a.u.)*

| | | Film thickness of non-magnetic coupling layer | | |
|---|---|---|---|---|
| | | W 0.2 nm | W 0.3 nm | W 0.4 nm |
| Element size D | 20 nm | 0.15 | | 0.36 |
| | 30 nm | 0.22 | 0.23 | |
| | 40 nm | 0.24 | 0.26 | 0.47 |
| | 50 nm | 0.36 | 0.36 | 0.77 |
| | 60 nm | 0.42 | 0.53 | 1.00 |
| | 70 nm | 0.60 | 0.72 | 1.34 |
| | 80 nm | | | 1.77 |

*Writing current (median value) of each sample when 1 represents an absolute value of the writing current of a sample with an element size of 60 nm and a non-magnetic coupling layer having a film thickness of 0.4 nm.

FIG. 14 and Table 2 reveal that, when the film thickness of the non-magnetic coupling layer is 0.4 nm, the relative value of the writing current $I_{C0}$ assumes high values ranging from 0.36 to 1.00 when the element size D ranges from 20 nm to 60 nm. By comparison, it was found that, when the film thickness of the non-magnetic coupling layer is 0.2 nm and 0.3 nm, the relative value of the writing current $I_{C0}$ assumes low values ranging from 0.15 to 0.53 which indicates an improvement in the characteristic of reducing the writing current $I_{C0}$.

Figure 15:
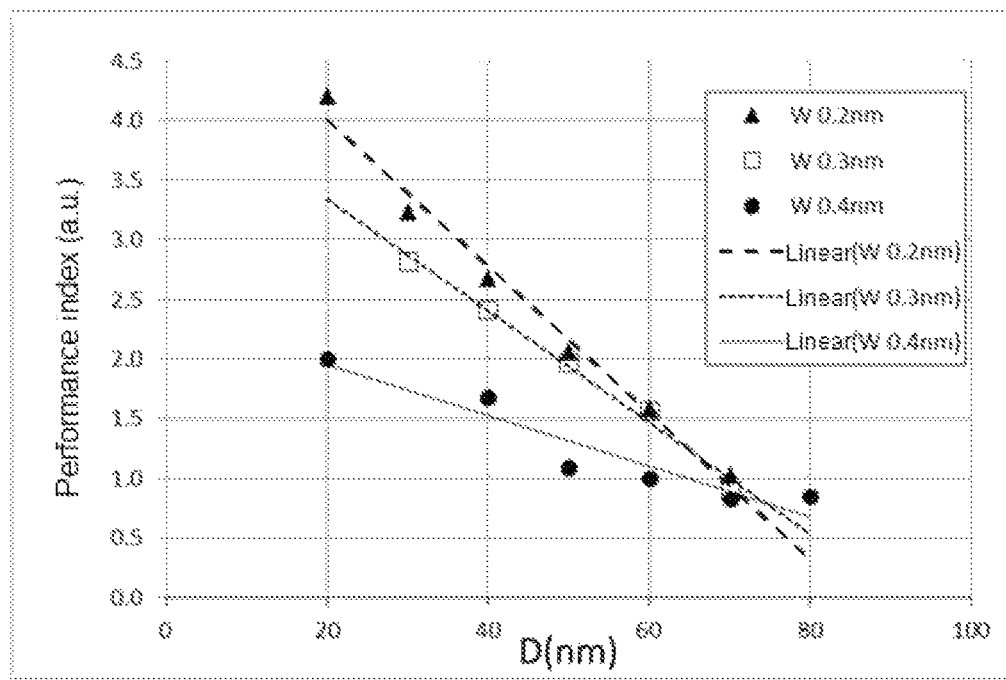
FIG. 15 is a graph showing a relationship among an element size, a film thickness of a non-magnetic coupling layer, and the performance index $\Delta/I_{C0}$.

FIG. 15 and Table 3 show a relationship of the performance index $\Delta/I_{C0}$ for each element size.

FIG. 15 shows an abscissa representing the element size D (nm) and an ordinate representing a relative value of the performance index $\Delta/I_{C0}$ when the performance index $\Delta/I_{C0}$ of a sample having an element size of 60 nm and a film thickness of a non-magnetic coupling layer of 0.4 nm is assumed to be 1, and plots respective relative values of the performance index $\Delta/I_{C0}$ while varying the film thickness of the non-magnetic coupling layer, and Table 3 organizes specific numerical values thereof.

TABLE 3

Performance index (a.u.)*

| | | film thickness of the non-magnetic coupling layer | | |
|---|---|---|---|---|
| | | 0.2 nm | 0.3 nm | 0.4 nm |
| element size D | 20 nm | 4.21 | | 2.00 |
| | 30 nm | 3.24 | 2.82 | |
| | 40 nm | 2.68 | 2.41 | 1.67 |
| | 50 nm | 2.06 | 1.97 | 1.09 |
| | 60 nm | 1.59 | 1.57 | 1.00 |
| | 70 nm | 1.03 | 0.90 | 0.82 |
| | 80 nm | | | 0.85 |

*Performance index of each sample when 1 represents the performance index of a sample with an element size of 60 nm and a non-magnetic coupling layer having a film thickness of 0.4 nm.

In FIG. 15, an approximating curve when the film thickness of the non-magnetic coupling layer is 0.2 nm is expressed by y=−0.0613x+5.2224, an approximating curve when the film thickness of the non-magnetic coupling layer is 0.3 nm is expressed by y=−0.0469x+4.2804, and an approximating curve when the film thickness of the non-magnetic coupling layer is 0.4 nm is expressed by y=−0.0213x+2.3749. In the comparison below, values calculated with the approximating curve equations are used.

As described above, the relative values of the performance index $\Delta/I_{C0}$ shown in FIG. 15 indicate that, the larger the relative value, the greater the performance as an element. As shown in FIG. 15, it was found that as the element size D decreases from 60 nm, the performance index $\Delta/I_{C0}$ generally increases monotonically. In addition, when the performance index $\Delta/I_{C0}$ in the case where the film thickness of the non-magnetic coupling layer is 0.4 nm and the performance index $\Delta/I_{C0}$ in the case where the film thickness of the non-magnetic coupling layer is 0.3 nm are compared with each other in a region where the element size D is 60 nm or smaller, the performance index $\Delta/I_{C0}$ when the film thickness is 0.3 nm is higher regardless of the element size D. This difference is clearly obvious when the element size D is 60 nm or smaller and becomes more prominent when the element size D is 40 nm or smaller. Furthermore, it was found that the performance index $\Delta/I_{C0}$ in the case where the film thickness of the non-magnetic coupling layer is 0.2 nm is higher than the performance index $\Delta/I_{C0}$ in the case where the film thickness of the non-magnetic coupling layer is 0.3 nm.

Checking details using Table 3 and values obtained by the approximating curves shown in FIG. 15 reveal that, when the element size D is 60 nm, while the relative value of the performance index $\Delta/I_{C0}$ in the case where the film thickness of the non-magnetic coupling layer is 0.4 nm is 1.10, the relative value of the performance index $\Delta/I_{C0}$ is improved by a factor of approximately 1.3 to 1.47 when the film thickness is 0.3 nm and the relative value of the performance index $\Delta/I_{C0}$ is improved by a factor of approximately 1.4 to 1.54 when the film thickness is 0.2 nm.

When the element size D is 40 nm, while the relative value of the performance index $\Delta/I_{C0}$ in the case where the film thickness of the non-magnetic coupling layer is 0.4 nm is 1.52, the relative value of the performance index $\Delta/I_{C0}$ is improved by a factor of approximately 1.6 to 2.40 when the film thickness is 0.3 nm and the relative value of the performance index $\Delta/I_{C0}$ is improved by a factor of approximately 1.8 to 2.77 when the film thickness is 0.2 nm.

When the element size D is 20 nm, while the relative value of the performance index $\Delta/I_{C0}$ in the case where the film thickness of the non-magnetic coupling layer is 0.4 nm is 1.95, the relative value of the performance index $\Delta/I_{C0}$ is improved by a factor of approximately 1.7 to 3.34 when the film thickness is 0.3 nm and the relative value of the performance index $\Delta/I_{C0}$ is improved by a factor of approximately 2.1 to 4.00 when the film thickness is 0.2 nm.

The evaluation results described above reveal that, when the element size is 60 nm or smaller, reducing the film thickness of the non-magnetic coupling layer to 0.3 nm or thinner enables the performance index $\Delta/I_{C0}$ to be improved while maintaining the thermal stability factor $\Delta$ at 60 or higher. It was found that this effect is particularly prominent when the element size D is 60 nm or smaller or 40 nm or smaller.

Reasons of the improvement in the performance index $\Delta/I_{C0}$ in a region where the element size is small and the film thickness of the non-magnetic coupling layer is thin are complex. One reason is that, since magnetization reversal of a plurality of magnetic layers in a recording layer more readily occurs in an integrated manner in a region where the element size is small, the smaller a damping constant $\alpha$ in precession of magnetization in the recording layer, the smaller an absolute value of the writing current $I_{C0}$, resulting in an improvement of the performance index $\Delta/I_{C0}$. The damping constant $\alpha$ refers to an effect of damping magnetization that processes around an easy axis of magnetization due to a spin-transfer torque or the like.

When magnetization reversal integrally rotates together at once, the writing current $I_{C0}$ is expressed by an equation represented by Math. 2 below (refer to Phys. Review. B, vol. 88, pp. 104426 (2013)).

$$I_{c0} = \left(\frac{2e}{\hbar}\right)\frac{2\alpha}{\eta}E \begin{cases} \Delta = \frac{E}{k_b T} \\ \eta = \frac{\sqrt{TMR(TMR+2)}}{2(TMR+1)} \\ \hbar = 1.054 \times 10^{-34} [J \cdot \sec] \\ k_B = 1.38 \times 10^{-23} [J \cdot K^{-1}] \\ e = 1.602 \times 10^{-19} [C] \end{cases} \quad \text{[Math. 2]}$$

In Math. 2, h (bar) denotes Planck's constant, e denotes an elementary charge, a denotes the damping constant, $\eta$ denotes a spin polarization factor related to a tunnel magnetoresistance ratio, E denotes an energy barrier, and TMR denotes the tunnel magnetoresistance ratio.

By substituting each constant and TMR=150% into the equation represented by Math. 2, the performance index $\Delta/I_{C0}$ is expressed by an equation represented by Math. 3.

$$\Delta/I_{c0}[A^{-1}] = 0.0178 \times 10^6 [A^{-1}] \times \frac{1}{\alpha} \quad \text{[Math. 3]}$$

Math. 3 shows that, since the performance index $\Delta/I_{C0}$ is an inverse of the damping constant $\alpha$, the smaller the damping constant $\alpha$ or, in other words, the smaller a damping effect, the greater the improvement of the performance index $\Delta/I_{C0}$. In addition, the thinner the film thickness of the non-magnetic coupling layer, the smaller the damping effect of magnetization.

This relationship is also consistent with a value of the damping constant $\alpha$ of the element for evaluation shown in FIG. 12 as measured by a ferromagnetic resonant method. A result is shown in Table 4.

TABLE 4

| $W_{thickness}^{film}$ | Damping constant |
|---|---|
| 0.2 nm | 0.0070 |
| 0.3 nm | 0.0085 |
| 0.4 nm | 0.0135 |

Furthermore, a damping constant when replacing W in the non-magnetic coupling layer shown in FIG. 12 with Mo is shown in Table 5.

TABLE 5

| $M_{D\ thickness}^{film}$ | Damping constant |
|---|---|
| 0.3 nm | 0.0030 |

Table 4 shows that, while the damping constant $\alpha$ takes a small value of 0.0085 or less when the film thickness of the non-magnetic coupling layer of W is 0.3 nm or less, the value of the damping constant $\alpha$ increase by a factor of approximately 1.59 to 0.0135 when the film thickness is 0.4 nm.

In addition, Table 5 shows that the damping constant $\alpha$ of the element for evaluation having a non-magnetic coupling layer of Mo is even smaller than the damping constant $\alpha$ of the element for evaluation having a non-magnetic coupling layer of W with a same film thickness. A correspondence between results shown in Table 3 and Table 4 reveal that an even larger performance index $\Delta/I_{C0}$ is obtained when using Mo.

On the other hand, while reasons of a low value of the performance index $\Delta/I_{C0}$ in a region where the element size is large and exceeds 70 nm are also complex, this is conceivably due to the fact that a domain wall motion mode becomes dominant in the magnetization reversal of the plurality of magnetic layers in the recording layer. In the domain wall motion mode, an energy barrier $E_b$ is expressed by an equation represented by Math. 4 below.

$$E_b = \sigma_W \times D_W \times t \quad \text{[Math. 4]}$$

In Math. 4, $\sigma_W$ denotes energy density of a domain wall, $D_W$ denotes a diameter of an element, and t denotes a film thickness of a recording layer.

As shown in Math. 4, when the domain wall motion mode becomes dominant, the larger the diameter (element size) of the element and the film thickness of the recording layer, the larger the energy barrier $E_b$, and Math. 4 and Math. 1 suggest that at least the thermal stability factor $\Delta$ can be improved.

Second Embodiment

Figure 2:
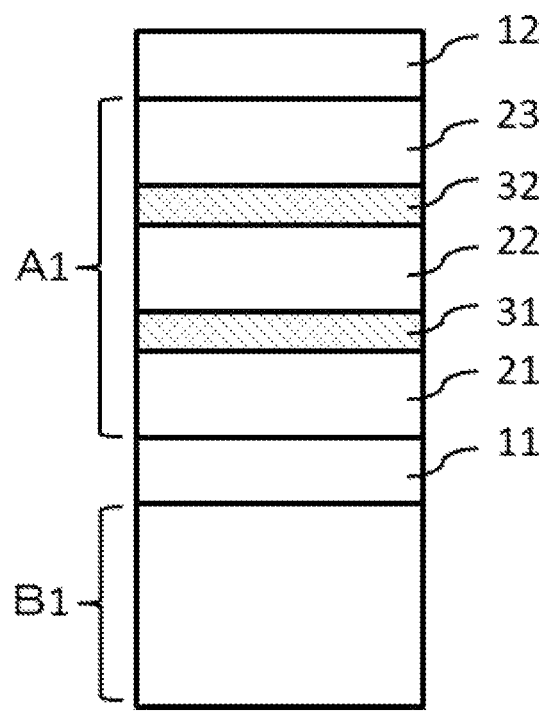
FIG. 2 is a longitudinal section view showing another example of a structure of the magnetoresistance effect element according to the present invention.

FIG. 2 shows a basic structure of a second embodiment of the present invention. In a basic structure of the magnetoresistance effect element, a first reference layer (B1)/a first junction layer (11)/a first magnetic layer (21)/a first non-magnetic coupling layer (31)/a second magnetic layer (22)/a second non-magnetic coupling layer (32)/a third magnetic layer (23)/a second junction layer (12) are sequentially and adjacently arranged. The first magnetic layer (21)/the first non-magnetic coupling layer (31)/the second magnetic layer (22)/the second non-magnetic coupling layer (32)/the third magnetic layer (23) constitute a first recording layer (A1), and the first reference layer (B1) and the first magnetic layer (21) are coupled by a magnetic tunnel junction by the first junction layer (11).

When the magnetoresistance effect element is connected to a magnetic memory cell, the magnetoresistance effect element has a lower electrode which is provided on the first reference layer (B1) on an opposite side to the first junction layer (11) and an upper electrode which is provided on the second junction layer (12) on an opposite side to the third magnetic layer (23).

The second embodiment is similar to the first embodiment with the exception of the characteristics described below.

The second non-magnetic coupling layer (32) contains a non-magnetic element such as W, Ta, Hf, Zr, Nb, Mo, Ti, V, Cr, Si, Al, B, Pd, and Pt. Since a non-magnetic coupling layer can also have perpendicular magnetic anisotropy in a direction of a film surface by absorbing B or the like in an adjacent magnetic layer, an element with a large atomic radius and a relatively large lattice spacing in a bcc (body-centered cubic lattice) is preferable. W, Ta, Hf, Zr, Nb, Mo, Ti, V, and the like are more preferable, and W and Mo are even more preferable.

For the purpose of increasing the performance index $\Delta/I_{co}$, a film thickness of the second non-magnetic coupling layer (32) is preferably 0.3 nm or less.

The third magnetic layer (23) is a ferromagnetic layer and whose magnetization direction can be reversed in a direction perpendicular to a film surface.

The third magnetic layer (23) is a ferromagnetic body which at least contains any of 3d ferromagnetic transition metal elements and more preferably contains at least one of Co, Fe, and Ni. Specific examples of the third magnetic layer (23) are Co, Fe, Ni, CoFe, FeNi, CoNi, CoB, FeB, NiB, CoFeB, FePt, TbTeCo, MnAl, and MnGa and, among these examples, Fe, Co, FeB, CoB, and CoFeB are more desirable.

In addition, the third magnetic layer (23) is desirably a material having interface magnetic anisotropy in a direction perpendicular to a film surface at an interface with the second junction layer (12), and Fe, Co, FeB, CoB, and CoFeB are more desirable. In other words, interface perpendicular magnetic anisotropy at the interface between the third magnetic layer (23) and the second junction layer (12) desirably makes magnetization of the third magnetic layer (23) perpendicular to a film surface.

Furthermore, the third magnetic layer (23) may contain a non-magnetic element such as W, Ta, Hf, Zr, Nb, Mo, Ti, V, Cr, Si, Al, B, Pd, and Pt. Among these non-magnetic elements, B and V are preferable also from the perspective of handleability.

A sum of film thicknesses of the first magnetic layer (21), the second magnetic layer (22), and the third magnetic layer (23) is preferably within a range of 2.4 nm to 4.8 nm and more preferably within a range of 2.8 nm to 3.4 nm. This is because, in both cases where the film thicknesses are thinner and the film thicknesses are thicker, perpendicular magnetic anisotropy weakens when MgO or the like is used in the first junction layer (11) and the second junction layer (12).

Third Embodiment

Figure 3:
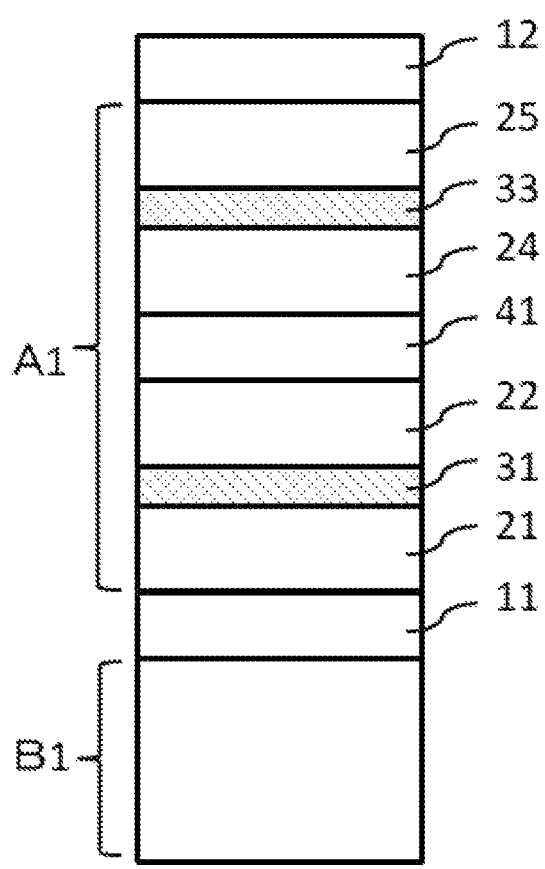
FIG. 3 is a longitudinal section view showing another example of a structure of the magnetoresistance effect element according to the present invention.

FIG. 3 shows a basic structure of a third embodiment of the present invention. In a basic structure of the magnetoresistance effect element, a first reference layer (B1)/a first junction layer (11)/a first magnetic layer (21)/a first non-magnetic coupling layer (31)/a second magnetic layer (22)/a non-magnetic insertion layer (41)/a fourth magnetic layer (24)/a third non-magnetic coupling layer (33)/a fifth magnetic layer (25)/a second junction layer (12) are sequentially and adjacently arranged. The first magnetic layer (21)/the first non-magnetic coupling layer (31)/the second magnetic layer (22)/the non-magnetic insertion layer (41)/the fourth magnetic layer (24)/the third non-magnetic coupling layer (33)/the fifth magnetic layer (25) constitute a first recording layer (A1), and the first reference layer (B1) and the first magnetic layer (21) are coupled by a magnetic tunnel junction by the first junction layer (11).

When the magnetoresistance effect element is connected to a magnetic memory cell, the magnetoresistance effect element has a lower electrode which is provided on the first reference layer (B1) on an opposite side to the first junction layer (11) and an upper electrode which is provided on the second junction layer (12) on an opposite side to the fifth magnetic layer (25).

The third embodiment is similar to the first embodiment with the exception of the characteristics described below.

A material containing O (oxygen) is used as the non-magnetic insertion layer (41), and the non-magnetic insertion layer (41) preferably contains at least Mg and O. In addition, a conductive oxide containing Mn, Fe, Co, Ni, V, Ti, Ga, Nb, Mo, Ru, Ir, Ce, Pb, Zn, In or the like or a weakly-oxidized conductive oxide of which oxidization is not complete such as Mg—O, Al_O, Mg—Al_O, Si—O, Ti—O, Hf—O, Ta—O, or W—O may be used, and the conductive oxide may contain a minute amount of other elements. Among the elements combined as described above, a content of some elements may be a minute amount or other magnetic materials or non-magnetic materials used to improve material characteristics may be further contained.

The non-magnetic insertion layer (41) has a function of magnetically coupling the second magnetic layer (22) and the fourth magnetic layer (24) with each other and imparting perpendicular magnetic anisotropy.

From the perspective of reducing a resistance area product RA or enhancing a magnetic coupling, a film thickness of the non-magnetic insertion layer (41) is preferably 1.2 nm or less, more preferably 1.0 nm or less, and even more preferably 0.8 nm or less.

The fourth magnetic layer (24) and the fifth magnetic layer (25) are ferromagnetic layers and whose magnetization direction can be reversed in a direction perpendicular to a film surface.

The fourth magnetic layer (24) and the fifth magnetic layer (25) are ferromagnetic bodies which at least contain any of 3d ferromagnetic transition metal elements and more preferably contains at least one of Co, Fe, and Ni. Specific examples of the fourth magnetic layer (24) and the fifth magnetic layer (25) are Co, Fe, Ni, CoFe, FeNi, CoNi, CoB, FeB, NiB, CoFeB, FePt, TbTeCo, MnAl, and MnGa and, among these examples, Fe, Co, FeB, CoB, and CoFeB are more desirable.

In addition, the fourth magnetic layer (24) is desirably a material having interface magnetic anisotropy in a direction perpendicular to a film surface at an interface with the non-magnetic insertion layer (41), the fifth magnetic layer (25) is desirably a material having interface magnetic anisotropy in a direction perpendicular to a film surface at an interface with the second junction layer (12), and Fe, Co, FeB, CoB, and CoFeB are more desirable. In other words, interface perpendicular magnetic anisotropy at the interface between the fourth magnetic layer (24) and the non-magnetic insertion layer (41) and the interface between the fifth magnetic layer (25) and the second junction layer (12) desirably makes magnetization of the fourth magnetic layer (24) and the fifth magnetic layer (25) perpendicular to a film surface.

Furthermore, the fourth magnetic layer (24) and the fifth magnetic layer (25) may contain a non-magnetic element such as W, Ta, Hf, Zr, Nb, Mo, Ti, V, Cr, Si, Al, B, Pd, and Pt. Among these non-magnetic elements, B and V are preferable also from the perspective of handleability.

A sum of film thicknesses of the first magnetic layer (21), the second magnetic layer (22), the fourth magnetic layer (24), and the fifth magnetic layer (25) is preferably within a range of 1.6 nm to 3.2 nm and more preferably within a range of 2.0 nm to 2.6 nm. This is because, in both cases where the film thicknesses are thinner and the film thicknesses are thicker, perpendicular magnetic anisotropy weakens when MgO or the like is used in the first junction layer (11), the non-magnetic insertion layer (41), and the second junction layer (12).

The third non-magnetic coupling layer (33) contains a non-magnetic element such as W, Ta, Hf, Zr, Nb, Mo, Ti, V, Cr, Si, Al, B, Pd, and Pt. Since a non-magnetic coupling layer can also have perpendicular magnetic anisotropy in a direction of a film surface by absorbing B or the like in an adjacent magnetic layer or the like, an element with a large atomic radius and a relatively large lattice spacing in a bcc (body-centered cubic lattice) is preferable. W, Ta, Hf, Zr, Nb, Mo, Ti, V, and the like are more preferable. W and Mo are even more preferable.

For the purpose of increasing the performance index $\Delta/I_{C0}$, a film thickness of the third non-magnetic coupling layer (33) is preferably 0.3 nm or less.

Fourth Embodiment

Figure 4:
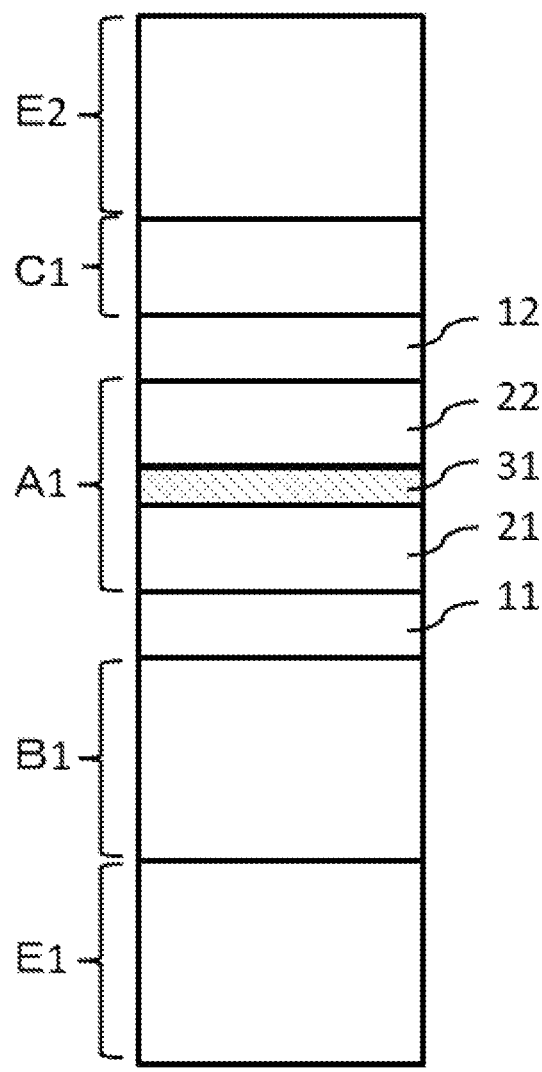
FIG. 4 is a longitudinal section view showing another example of a structure of the magnetoresistance effect element according to the present invention.

FIG. 4 shows a basic structure of a fourth embodiment of the present invention. In a basic structure of the magnetoresistance effect element, a lower electrode (E1)/a first reference layer (B1)/a first junction layer (11)/a first magnetic layer (21)/a first non-magnetic coupling layer (31)/a second magnetic layer (22)/a second junction layer (12)/a first protective layer (C1)/an upper electrode (E2) are sequentially and adjacently arranged. The first magnetic layer (21)/the first non-magnetic coupling layer (31)/the second magnetic layer (22) constitute a first recording layer (A1), and the first reference layer (B1) and the first magnetic layer (21) are coupled by a magnetic tunnel junction by the first junction layer (11).

The fourth embodiment is similar to the first embodiment with the exception of the characteristics described below.

The lower electrode (E1) is connected to an end face of the first reference layer (B1) on an opposite side to the first junction layer (11).

Examples of a laminate structure of the lower electrode (E1) include Ta (5 nm)/Ru (5 nm)/Ta (10 nm)/Pt (5 nm) and Ta (5 nm)/TaN (20 nm), and the like.

The first protective layer (C1) is provided on the second junction layer (12) on an opposite side to the second magnetic layer (22).

The first protective layer (C1) is preferably constituted by a material that protects the recording layer and examples thereof include Ta, Ru, Pt, and CoFeB, and the like.

The upper electrode (E2) is connected to an end face of the first protective layer (C1) on an opposite side to the first recording layer (A1).

Examples of a laminate structure of the upper electrode (E2) include Ta (50 nm)/Ru (50 nm), Ru (1 to 50 nm), and Pt (1 to 50 nm)/Ta (50 nm), and the like.

Fifth Embodiment

Figure 5:
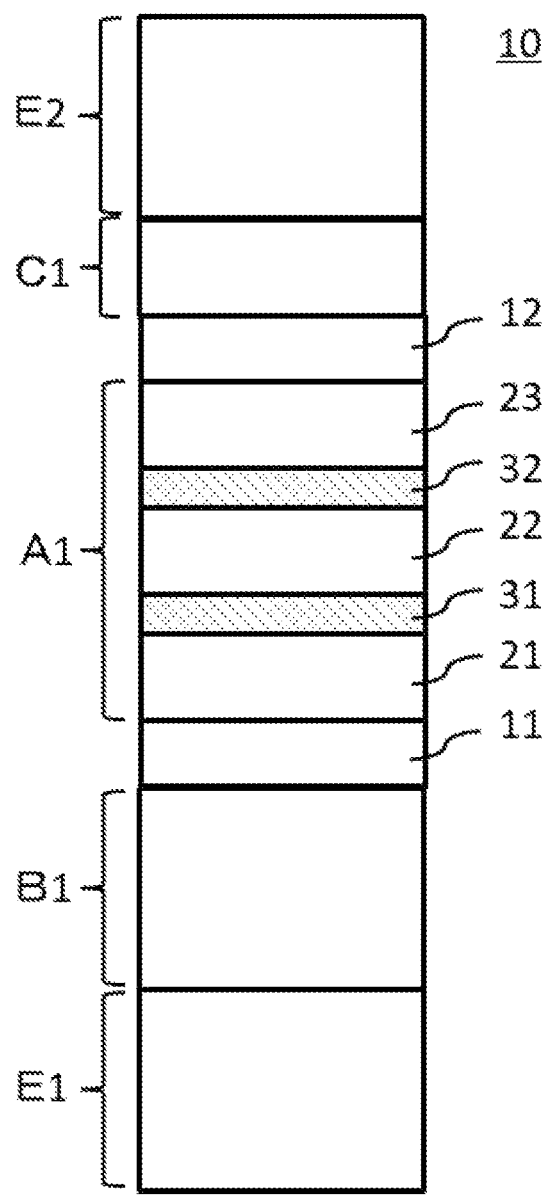
FIG. 5 is a longitudinal section view showing another example of a structure of the magnetoresistance effect element according to the present invention.

FIG. 5 shows a basic structure of a fifth embodiment of the present invention. In a basic structure of the magnetoresistance effect element, a lower electrode (E1)/a first reference layer (B1)/a first junction layer (11)/a first magnetic layer (21)/a first non-magnetic coupling layer (31)/a second magnetic layer (22)/a second non-magnetic coupling layer (32)/a third magnetic layer (23)/a second junction layer (12)/a first protective layer (C1)/an upper electrode (E2) are sequentially and adjacently arranged. The first magnetic layer (21)/the first non-magnetic coupling layer (31)/the second magnetic layer (22)/the second non-magnetic coupling layer (32)/the third magnetic layer (23) constitute a first recording layer (A1), and the first reference layer (B1) and the first magnetic layer (21) are coupled by a magnetic tunnel junction by the first junction layer (11). Details of the fifth embodiment are similar to those of the second and fourth embodiments.

Sixth Embodiment

Figure 6:
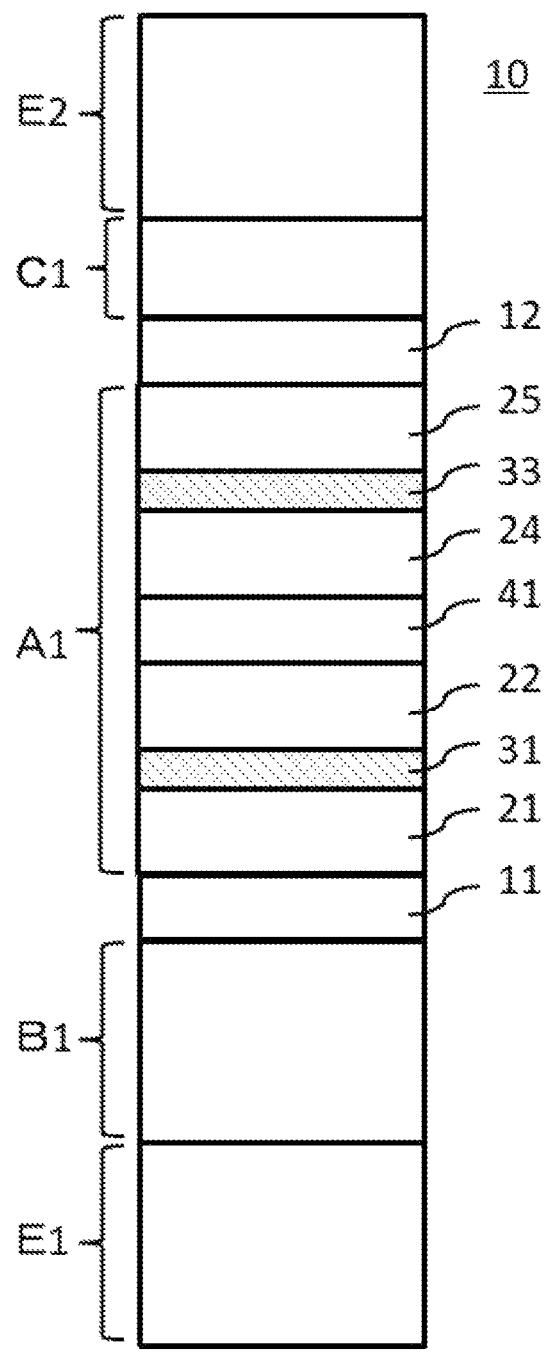
FIG. 6 is a longitudinal section view showing another example of a structure of the magnetoresistance effect element according to the present invention.

FIG. 6 shows a basic structure of a sixth embodiment of the present invention. In a basic structure of the magnetoresistance effect element, a lower electrode (E1)/a first reference layer (B1)/a first junction layer (11)/a first magnetic layer (21)/a first non-magnetic coupling layer (31)/a second magnetic layer (22)/a non-magnetic insertion layer (41)/a fourth magnetic layer (24)/a third non-magnetic coupling layer (33)/a fifth magnetic layer (25)/a second junction layer (12)/a first protective layer (C1)/an upper electrode (E2) are sequentially and adjacently arranged. The first magnetic layer (21)/the first non-magnetic coupling layer (31)/the second magnetic layer (22)/the non-magnetic insertion layer (41)/the fourth magnetic layer (24)/the third non-magnetic coupling layer (33)/the fifth magnetic layer (25) constitute a first recording layer (A1), and the first reference layer (B1) and the first magnetic layer (21) are coupled by a magnetic tunnel junction by the first junction layer (11).

Details of the sixth embodiment are similar to those of the third and fourth embodiments.

Seventh Embodiment

Figure 7:
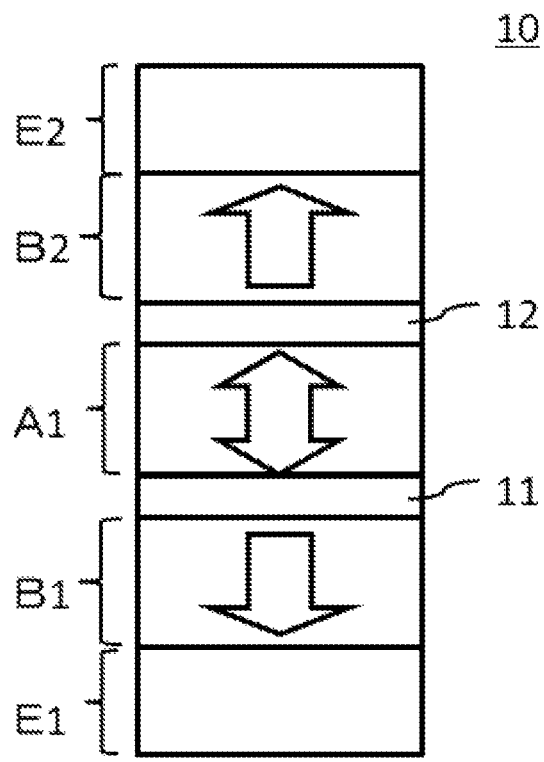
FIG. 7 is a longitudinal section view showing another example of a structure of the magnetoresistance effect element according to the present invention.

FIG. 7 shows a structure according to a seventh embodiment of the present invention. In a structure of the magnetoresistance effect element, a lower electrode (E1)/a first reference layer (B1)/a first junction layer (11)/a first recording layer (A1)/a second junction layer (12)/a second reference layer (B2)/an upper electrode (E2) are sequentially and adjacently arranged.

The seventh embodiment is similar to the first to fourth embodiments with the exception of the characteristics described below.

A structure of the recording layer disclosed in the first to third embodiments may be arranged as the first recording layer (A1).

The second reference layer (B2) has a similar structure to the first reference layer (B1). In order to improve the performance index $\Delta/I_{C0}$, in FIG. 7, magnetization directions of the first reference layer (B1) and the second reference layer (B2) are preferably in opposite directions.

In the seventh embodiment, both the first junction layer (11) and the second junction layer (12) act as tunnel barrier layers.

Eighth Embodiment

Figure 8:
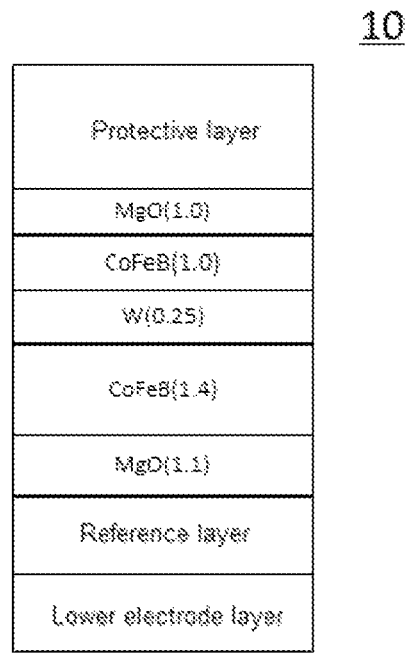
FIG. 8 is a longitudinal section view showing another example of a structure of the magnetoresistance effect element according to the present invention.

FIG. 8 shows a structure according to an eighth embodiment of the present invention. In a structure of the magnetoresistance effect element, a lower electrode/a reference layer/MgO (1.1 nm)/CoFeB (1.4 nm)/W (0.25 nm)/CoFeB (1.0 nm)/MgO (1.0 nm)/a protective layer are sequentially and adjacently arranged.

Respective layers other than MgO were formed by DC magnetron sputtering while the MgO layer was formed by RF magnetron sputtering and, subsequently, heat treatment (400° C., 1 hour) was performed in a heat treatment furnace in a magnetic field.

Next, a mask of a pattern of a recording element was formed with an electron beam lithography device, and selective etching was performed using Ar ions with respect to a lamination layer to form the present magnetoresistance effect element.

Ninth Embodiment

Figure 9:
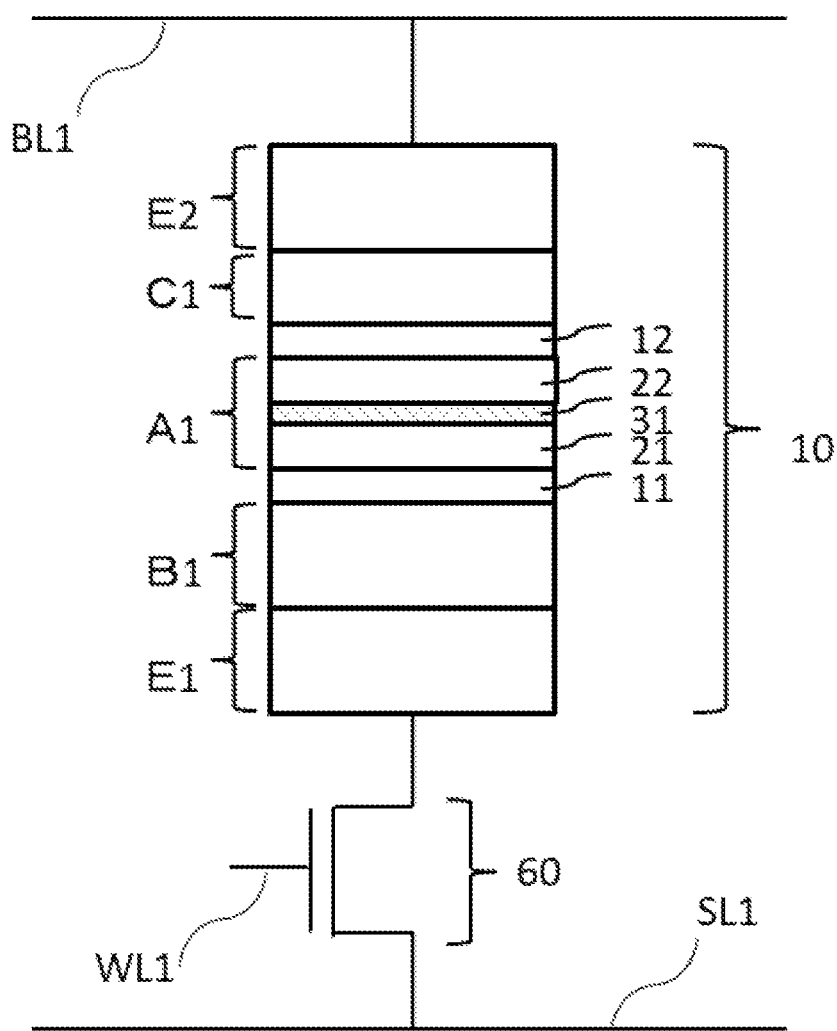
FIG. 9 shows an example of a memory cell including a structure of the magnetoresistance effect element according to the present invention.

FIG. 9 shows a structure according to a ninth embodiment of the present invention. This is a memory cell in which the magnetoresistance effect element according to the present invention is arranged in plurality.

In a memory cell (50) according to the ninth embodiment, a magnetoresistance effect element (10) and a select transistor (60) are electrically connected in series. A source electrode of the select transistor (60) being electrically connected to the lower electrode (E1) of the magnetoresistance effect element (10) is connected to a source line (SL1), a drain electrode is electrically connected to a bit line (BL1) from the upper electrode (E2) of the magnetoresistance effect element (10), and a gate electrode is electrically connected to a word line (WL1).

While the structure of the fourth embodiment has been exemplified for the magnetoresistance effect element (10), the structure of any of the first to eighth embodiments may be adopted.

In addition, the magnetoresistance effect element (10) may be connected upside-down with respect to FIG. 9. In other words, the source electrode of the select transistor (60) being electrically connected to the upper electrode (E2) of the magnetoresistance effect element (10) may be connected to a source line (SL1), a drain electrode may be electrically connected to a bit line (BL1) from the lower electrode (E1) of the magnetoresistance effect element (10), and a gate electrode may be electrically connected to a word line (WL1).

Tenth Embodiment

Figure 10:
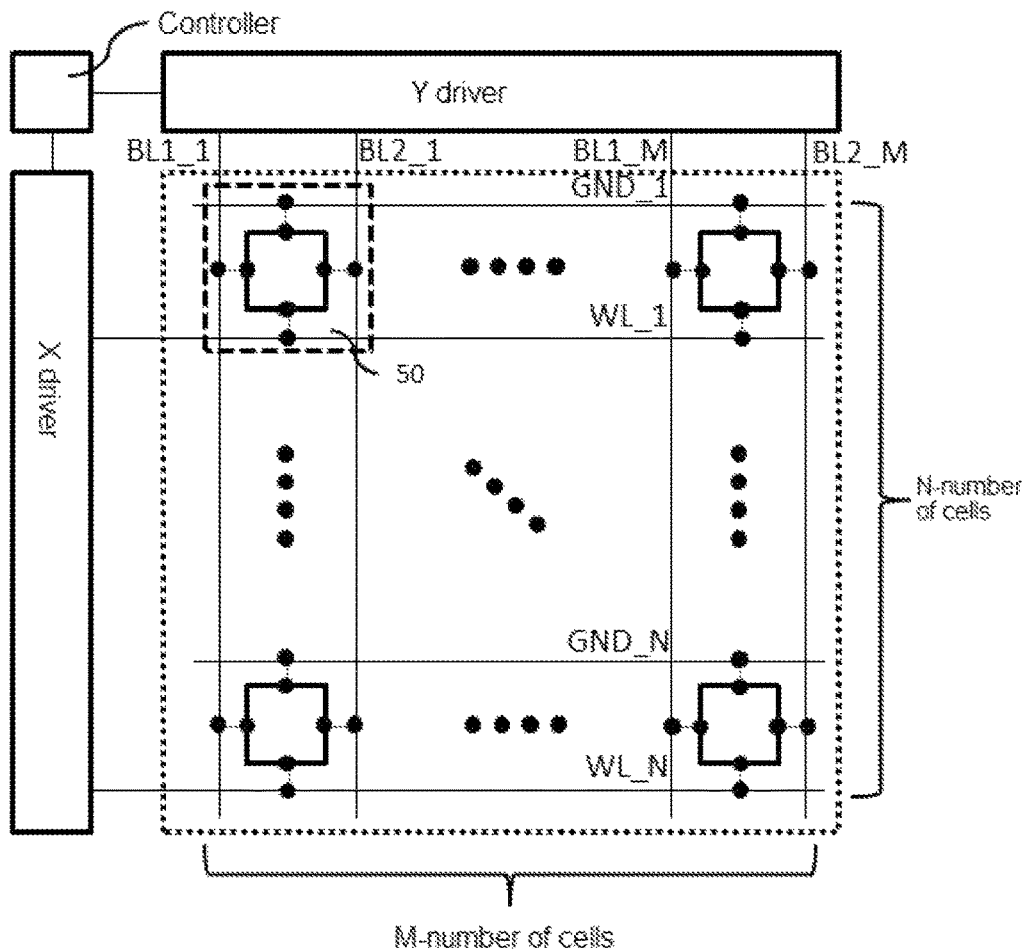
FIG. 10 is an example of a block diagram of a magnetic memory in which the magnetoresistance effect element according to the present invention is arranged in plurality.
Figure 11:
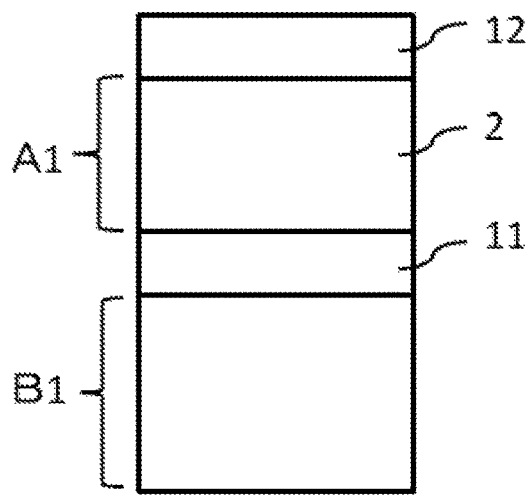
FIG. 11 is a longitudinal section view showing a structure of a conventional magnetoresistance effect element.

FIG. 10 shows, as a tenth embodiment, an example of a magnetic memory including a plurality of memory cells (50) having a structure according to the first to ninth embodiments.

The magnetic memory includes a memory cell array, an X driver, a Y driver, and a controller. The memory cell array includes magnetic memory cells arranged in an array. The X driver is connected to a plurality of word lines (WLs) and the Y driver is connected to a plurality of bit lines (BLs), and both of the X driver and the Y driver function as reading means and writing means.

It should be noted that the layer structure described in each embodiment of the present invention need only be adjacently arranged and a lamination method, a lamination order, vertical and horizontal orientations, and the like thereof are not limited.

REFERENCE SIGNS LIST

10 Magnetoresistance effect element
11 First junction layer
12 Second junction layer
13 Third junction layer
21 First magnetic layer
22 Second magnetic layer
23 Third magnetic layer
24 Fourth magnetic layer
25 Fifth magnetic layer
31 First non-magnetic coupling layer
32 Second non-magnetic coupling layer
33 Third non-magnetic coupling layer
41 Non-magnetic insertion layer
50 Memory cell
60 Select transistor
A1 First recording layer
A2 Second recording layer
B1 First reference layer
B2 Second reference layer
B3 Third reference layer
C1 Protective layer
E1 Lower electrode
E2 Upper electrode
BL1 First bit line
BL2 Second bit line
GND Ground line
SL1 Source line
WL1 Word line

The invention claimed is:

1. A magnetoresistance effect element comprising:
a first reference layer (B1);
a first junction layer (11) which is provided adjacent to the first reference layer (B1);
a first magnetic layer (21) which is provided adjacent to the first junction layer (11) on an opposite side to the first reference layer (B1) and whose magnetization direction is a direction perpendicular to a film surface;
a first non-magnetic coupling layer (31) which is provided adjacent to the first magnetic layer (21) on an opposite side to the first junction layer (11);
a second magnetic layer (22) which is provided adjacent to the first non-magnetic coupling layer (31) on an opposite side to the first magnetic layer (21) and whose magnetization direction is a direction perpendicular to the film surface; and
a second junction layer (12) which is provided adjacent to the second magnetic layer (22) on an opposite side to the first non-magnetic coupling layer (31),
wherein
the first magnetic layer (21), the first non-magnetic coupling layer (31), and the second magnetic layer (22) constitute a first recording layer (A1),
the first junction layer (11) and the second junction layer (12) include O (oxygen) and the first junction layer (11) is a tunnel barrier layer,
the first non-magnetic coupling layer (31) includes W or Mo and a film thickness of the first non-magnetic coupling layer (31) is 0.2 nm or more and 0.3 nm or less, and
an element size is 50 nm or smaller.

2. A magnetoresistance effect element comprising:
a first reference layer (B1);
a first junction layer (11) which is provided adjacent to the first reference layer (B1);
a first magnetic layer (21) which is provided adjacent to the first junction layer (11) on an opposite side to the first reference layer (B1) and whose magnetization direction is a direction perpendicular to a film surface;

a first non-magnetic coupling layer (31) which is provided adjacent to the first magnetic layer (21) on an opposite side to the first junction layer (11);

a second magnetic layer (22) which is provided adjacent to the first non-magnetic coupling layer (31) on an opposite side to the first magnetic layer (21) and whose magnetization direction is a direction perpendicular to the film surface; and a second junction layer (12) which is provided adjacent to the second magnetic layer (22) on an opposite side to the first non-magnetic coupling layer (31), wherein the first magnetic layer (21), the first non-magnetic coupling layer (31), and the second magnetic layer (22) constitute a first recording layer (A1), the first junction layer (11) and the second junction layer (12) include O (oxygen) and the first junction layer (11) is a tunnel barrier layer, a film thickness of the first non-magnetic coupling layer (31) is 0.2 nm or more and 0.3 nm or less, and an element size is 40 nm or smaller.

3. The magnetoresistance effect element according to claim 2, wherein the first non-magnetic coupling layer is made of any of W, Ta, Hf, Zr, Nb, Mo, Ti, and V.

4. A magnetoresistance effect element comprising:

a first reference layer (B1);

a first junction layer (11) which is provided adjacent to the first reference layer (B1);

a first magnetic layer (21) which is provided adjacent to the first junction layer (11) on an opposite side to the first re fence layer (B1) and whose magnetization direction is a direction perpendicular to a film surface;

a first non-magnetic coupling layer (31) which is provided adjacent to the first magnetic layer (21) on an opposite side to the first junction layer (11);

a second magnetic layer (22) which is provided adjacent to the first non-magnetic coupling layer (31) on an opposite side to the first magnetic layer (21) and whose magnetization direction is a direction perpendicular to the film surface;

a second non-magnetic coupling layer (32) which is provided adjacent to the second magnetic layer (22) on an opposite side to the first non-magnetic coupling layer (31);

a third magnetic layer (23) which is provided adjacent to the second non-magnetic coupling layer (32) on an opposite side to the second magnetic layer (22) and whose magnetization direction is a direction perpendicular to the film surface; and a second junction layer (12) which is provided adjacent to the third magnetic layer (23) on an opposite side to the second non-magnetic coupling, layer (32), wherein the first magnetic layer (21), the first non-magnetic coupling layer (31), the second magnetic layer (22), the second non-magnetic coupling layer (32) and the third magnetic layer (23) constitute a first recording layer (A1), the first junction layer (11) and the second junction layer (12) include O (oxygen) and the first junction layer (11) is a tunnel barrier layer, the first non-magnetic coupling layer (31) and the second non-magnetic coupling layer (32) include W or Mo, a film thickness of each of the first non-magnetic coupling (31) and the second non-magnetic coupling layer (32) is 0.2 nm or more and 0.3 nm or less, and an element size is 50 nm or smaller.

5. A magnetoresistance effect element comprising:

a first reference layer (B1);

a first junction layer (11) which is provided adjacent to the first reference layer (B1);

a first magnetic layer (21) which is provided adjacent to the first junction layer (11) on an opposite side to the first reference layer (B1) and whose magnetization direction is a direction perpendicular to a film surface;

a first non-magnetic coupling layer (31) which is provided adjacent to the first magnetic layer (21) on an opposite side to the first junction layer (11);

a second magnetic layer (22) which is provided adjacent to the first non-magnetic coupling layer (31) on an opposite side to the first magnetic layer (21) and whose magnetization direction is a direction perpendicular to the film surface;

a non-magnetic insertion layer (41) which is provided adjacent to the second magnetic layer (22) on an opposite side to the first non-magnetic coupling layer (31);

a fourth magnetic layer (24) Which is provided adjacent to the non-magnetic insertion layer (41) on an opposite side to the second magnetic layer (22) and whose magnetization direction is a direction perpendicular to the film surface;

a third non-magnetic coupling layer (33) which is provided adjacent to the fourth magnetic layer (24) on an opposite side to the non-magnetic insertion layer (41);

a fifth magnetic layer (25) which is provided adjacent to the third non-magnetic coupling layer (33) on an opposite side to the fourth magnetic layer (24) and whose magnetization direction is a direction perpendicular to the film surface; and a second junction layer (12) ich is provided adjacent to the fifth magnetic layer (25) on an opposite side to the third non-magnetic coupling layer (33), wherein the first magnetic layer (21), the first non-magnetic coupling layer (31), the second magnetic layer (22), the non-magnetic insertion layer (41) the fourth magnetic (24), the third non-magnetic coupling layer (33), and the fifth magnet layer (25) constitute a first recording layer (A1), the first junction layer (11), the second junction layer (12) and the non-magnetic insertion layer (41) include O (oxygen) and the first junction layer (11) is a tunnel barrier layer, the first non-magnetic coupling layer (31) and the third non-magnetic coupling layer (33) include W or Mo, a film thickness of each of the first non-magnetic coupling layer (31) and the third non-magnetic coupling layer (33) is 0.2 nm or more and 0.3 nm or less, and an element size is 50 nm or smaller.

6. A magnetic memory comprising the magnetoresistance effect element according to any one of claims 1, 2, 3, 4 or 5.

* * * * *